United States Patent [19]
Gutierrez

[11] Patent Number: 6,043,661
[45] Date of Patent: *Mar. 28, 2000

[54] SCHOOL BUS AND TRAILER SYSTEMS TESTER

[76] Inventor: Alejandro Gutierrez, P.O. Box 1322, Edinberg, Tex. 78539

[*] Notice: This patent is subject to a terminal disclaimer.

[21] Appl. No.: 08/798,057

[22] Filed: Feb. 11, 1997

Related U.S. Application Data

[63] Continuation-in-part of application No. 08/528,643, Sep. 7, 1995, Pat. No. 5,602,482.

[51] Int. Cl.[7] .................................................. G01L 5/28
[52] U.S. Cl. ......................... 324/504; 324/503; 324/539; 73/129; 340/431
[58] Field of Search .................................. 324/504, 503, 324/133, 556; 73/129; 340/431, 458

[56] References Cited

U.S. PATENT DOCUMENTS

| | | |
|---|---|---|
| 3,737,767 | 6/1973 | Slutsky . |
| 4,547,722 | 10/1985 | Sarlo . |
| 4,586,370 | 5/1986 | Massender ............................. 324/504 |
| 4,617,510 | 10/1986 | Deicke et al. . |
| 4,866,390 | 9/1989 | Butchko . |
| 4,884,032 | 11/1989 | LaPensee . |
| 4,956,561 | 9/1990 | Tamer . |
| 5,086,277 | 2/1992 | Hammerly . |
| 5,095,276 | 3/1992 | Nepil . |
| 5,602,482 | 2/1997 | Gutierrez ............................. 324/504 |

FOREIGN PATENT DOCUMENTS

| | | |
|---|---|---|
| 2724670A1 | 12/1978 | Germany . |
| 1447700 | 8/1976 | United Kingdom . |

*Primary Examiner*—Josie Ballato
*Assistant Examiner*—Jose M. Solis
*Attorney, Agent, or Firm*—Richard C. Litman

[57] ABSTRACT

A portable diagnostic device for checking electrical signalling systems of school buses and/or tractor trailers. The device has several receptacles for connection to a corresponding receptacle or pin connector of a school bus and most types of trailers. One electrical circuit includes switches for energizing individual signalling or illumination circuits of the trailer individually, and indicating lamps for annunciating circuit operability. Another electrical circuit includes switches for energizing individual signalling or illumination circuits of the school bus individually, and indicating lamps for annunciating circuit operability. The device, which is contained on a wheeled cart, has its own power supply and circuit overcurrent protective devices, and is thus independent of a school bus and a tractor, both of which normally generate the signals. The device enables a shop to perform a safety check for many varieties of school buses and trailers.

23 Claims, 9 Drawing Sheets

SCHOOL BUS AND TRAILER SYSTEMS TESTER

CROSS-REFERENCE TO RELATED APPLICATIONS

This application is a continuation-in-part of U.S. Utility application Ser. No. 08/528,643 filed Sep. 7, 1995, now U.S. Pat. No. 5,602,482 issued on Feb. 11, 1997.

BACKGROUND OF THE INVENTION

1. Field of the Invention

The present invention relates to a testing and annunciation device for verifying operation of the signalling system of a school bus and/or trailers. The testing device is contained within a small wheeled vehicle, and enables certain electrical and mechanical systems of the school bus to be monitored. The testing device containing vehicle is designed to be maneuvered, connected, and operated manually by one person.

2. Description of the Prior Art

School buses are equipped with many signalling and safety features. Illuminated signalling lamps of the school bus include: headlights, turn signal lights, four-way flashing lights, marker lights, tail lights, stop lights, beacon lights, reversing lights, and an eight-light warning system. Safety features may include redundant pneumatic braking systems and electrical braking systems of the type disclosed in the above-referenced parent patent. School buses must be inspected periodically for operability of these signalling and safety systems. The prior art will be discussed in the order of their perceived relevance to the present invention.

U.S. Pat. No. 4,617,510 issued on Oct. 14, 1986, to Axel Deicke et al. describes a testing installation for electric circuits of a motor vehicle comprising a generator which produces signals similar to the output signals of the control unit and feeds the same signals cyclically to the loads or the switches resulting only in the switching of the critical portions of the electric circuits to test their functional ability optically and acoustically. The present invention does not require a generator to test the electrical signal system of a school bus, and is not concerned with the testing of the driving motors for the windshield cleaner and heater fan.

U.S. Pat. No. 5,086,277 issued on Feb. 4, 1992, to Robert C. Hammerly describes an apparatus and method for performing diagnostic tests on the electrical systems of recreational vehicles and the like. The testing apparatus is coupled to a plug used to connect the electrical system of a towed or trailer vehicle with a main or powered vehicle. The testing involves the connection of each plug terminal to the tester apparatus and selectively activating to compare with expected values. The present invention is not concerned with the comparison of electrical signals with any expected values or the use of ammeters or volt meters.

U.S. Pat. No. 4,956,561 issued on Sep. 11, 1980, to Antanios B. Tamer describes a smart power connector for controlling the flow of electrical current from a vehicular smart power multiplexing network to the various peripheral devices and components of a vehicle. The instant invention does not require a complex multiplexing system.

U.S. Pat. No. 3,737,767 issued on Jun. 5, 1973, to Robert Slutsky describes a small diagnostic device which is directly plugged into a socket integral with a trailer. This device is usable only with vehicles having a seven conductor plug. The device cannot test marker lights independently of tail lights, as can the present invention, and, because it dedicates only one indicator to turn signals, cannot readily monitor a four-way flashing function.

U.S. Pat. No. 4,547,722 issued on Oct. 15, 1985, to Thomas J. Sarlo describes a diagnostic device mounted in a wheeled cart. This device is also limited to testing vehicles having the particular type of receptacle provided for.

U.S. Pat. No. 5,095,276 issued on Mar. 10, 1992, to James C. Nepil describes a circuit for diagnosing the operability of a trailer's electrical system. This circuit is considerably more complicated than that of the present invention, while not providing the versatility of present invention.

U.S. Pat. No. 4,866,390 issued on Sep. 12, 1989, to Joseph R. Butchko describes a vehicle light testing system for testing a plurality of lights using a scanning sequence which includes detection of shorts, bad grounds, and a low testing battery voltage. The present invention does not involve a scanning sequence and the testing of shorts, etc.

U.S. Pat. No. 4,884,032 issued on Nov. 28, 1989, to Kenneth R. LaPensee describes a tractor-trailer light system tester for military trailers having seven conductors, and includes the testing of light and brake switches. The present invention is not concerned with such testing, per se.

U.K. Patent Specification No. 1,477,700 published on Aug. 25, 1976, for Nissan Motor Company, Limited describes an apparatus for detecting faulty indicating lamps of a vehicle by connecting a common conductor with switch means and diodes to test the indicator lamps for the oil pressure, the voltage regulator and the generator. The present invention is not concerned with the operability of such indicator lamps.

German Patent Specification No. DE 2,724,670 A1 published on Dec. 12, 1978, describes a lighting system tester for trailers by using either a step-down transformer (220 V./12 V.) or the tractor's battery to test the stop lights, parking lights and turn signal lights with five separate switches. The present invention is capable of testing a greater number of lighting systems required by a school bus.

The prior art devices are particularly intended for use with trailers for over the road tractor and trailer combinations, and have electrical interface components specifically found on such combinations. The prior art devices lack the ability to be compatible with a variety of lighting systems present on a school bus.

None of the above inventions and patents, taken either singly or in combination, is seen to describe the instant invention as claimed.

SUMMARY OF THE INVENTION

The present invention provides a small, maneuverable, wheeled apparatus which an individual technician can connect to a school bus and/or a tractor trailer for the purpose of analyzing or monitoring the signalling systems. Most of these systems are electrical, and operate specified lamps. Other optional systems monitor pneumatic and hydraulic systems. The apparatus generates electrical signals for operating the various lamps on the school bus. Indicators provided on the apparatus indicate continuity of the various circuits, thus confirming operability of the bus lamps. The novel signal testing device is specifically intended to be compatible with school buses by installing modular wiring connectors for extending an electrical signalling system from the buses. A power supply is provided so that the device and the testing procedure are independent of the power supply of the bus. Overcurrent devices in the testing device provide protection to the circuitry. Flashers are provided to assist in identifying operation of lights which normally flash when operating, such as the turn signals and the four way alarm flasher. Additionally, the testing device has electrical power circuits for testing electric brakes, air pressure for testing the integrity of pneumatic braking systems, and hydraulic pressure for testing hydraulic servo lifting systems.

Thus, a service shop having the novel testing device will be able to perform safety checks on school buses, tractor trailers or the like which are brought in for service, and will not be dependent upon electrical connectors specifically associated with these buses.

Accordingly, it is a principal object of the invention to provide a mobile signal tester, usable by a single person for performing safety checks on school buses and/or tractor trailers.

Another object of the invention is to provide a signal tester which is readily compatible with different types of buses and tractor trailers.

It is another object of the invention to generate electrical signals, to transmit the electrical signals to the illumination and signalling circuits of a school bus, and to employ the electrical signals to illuminate annunciator lamps on the signal tester.

An additional object of the invention is to incorporate flashers into circuits of the signal tester for testing the headlights, turn signal lights, four-way flashing lights, marker lights, tail lights, stop lights, beacon lights, back up or reversing lights, and the eight-light warning system of the school bus.

It is an object of the invention to provide improved elements and arrangements thereof in a mobile school bus signal testing apparatus for the purposes described which is inexpensive, dependable and fully effective in accomplishing its intended purposes. These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
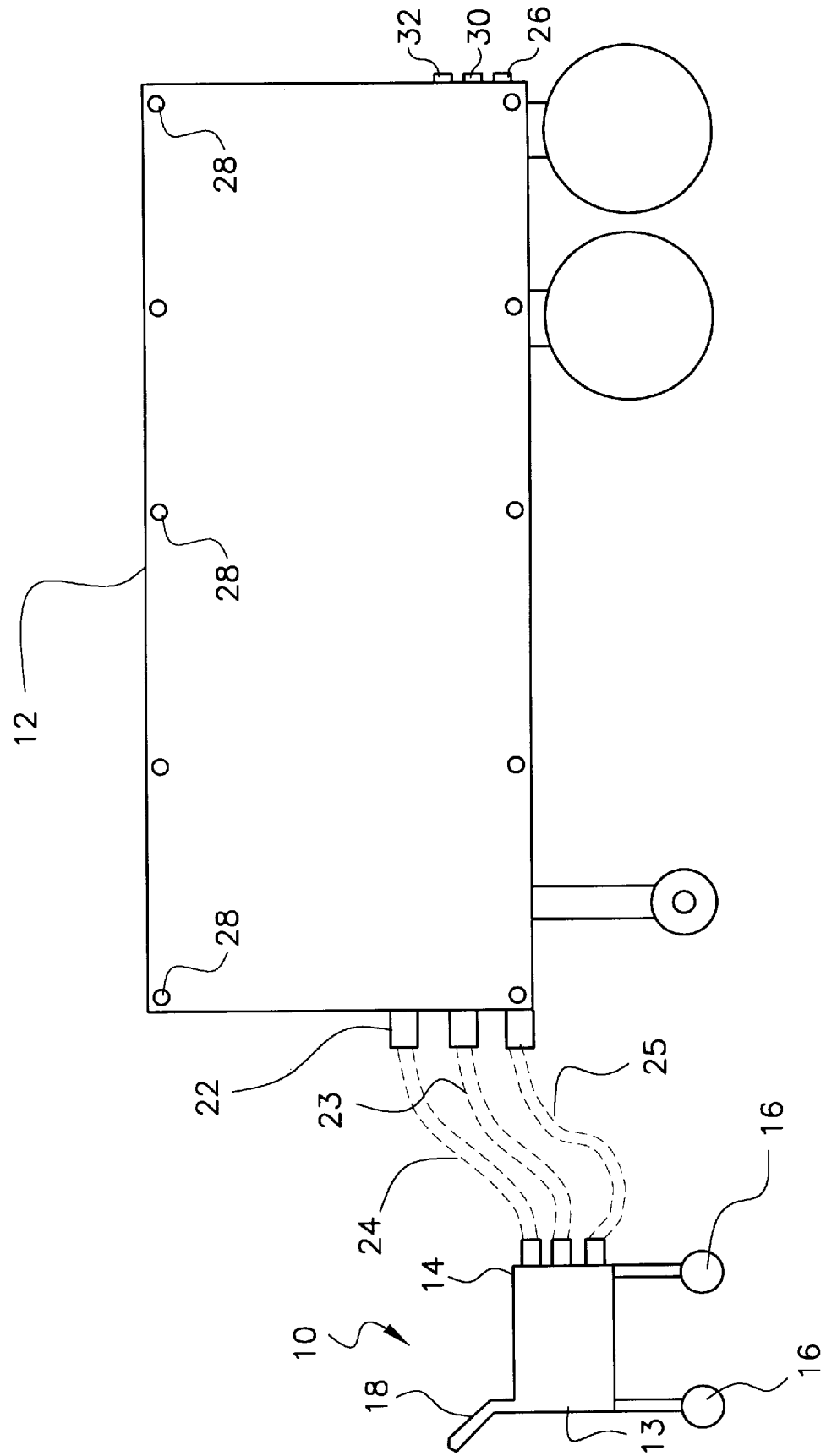
FIG. 1 is an environmental, side elevational view of the invention connected to a trailer.

The novel systems tester 10 is seen in FIG. 1 connected to a trailer 12. Tester 10 comprises a cart 13 having a housing 14 enclosing electrical circuitry, wheels 16 supporting the cart, and a handle 18 for maneuvering the cart. This compact device enables tester 10 to be maneuvered into place, connected, and operated by one person.

Figure 3:
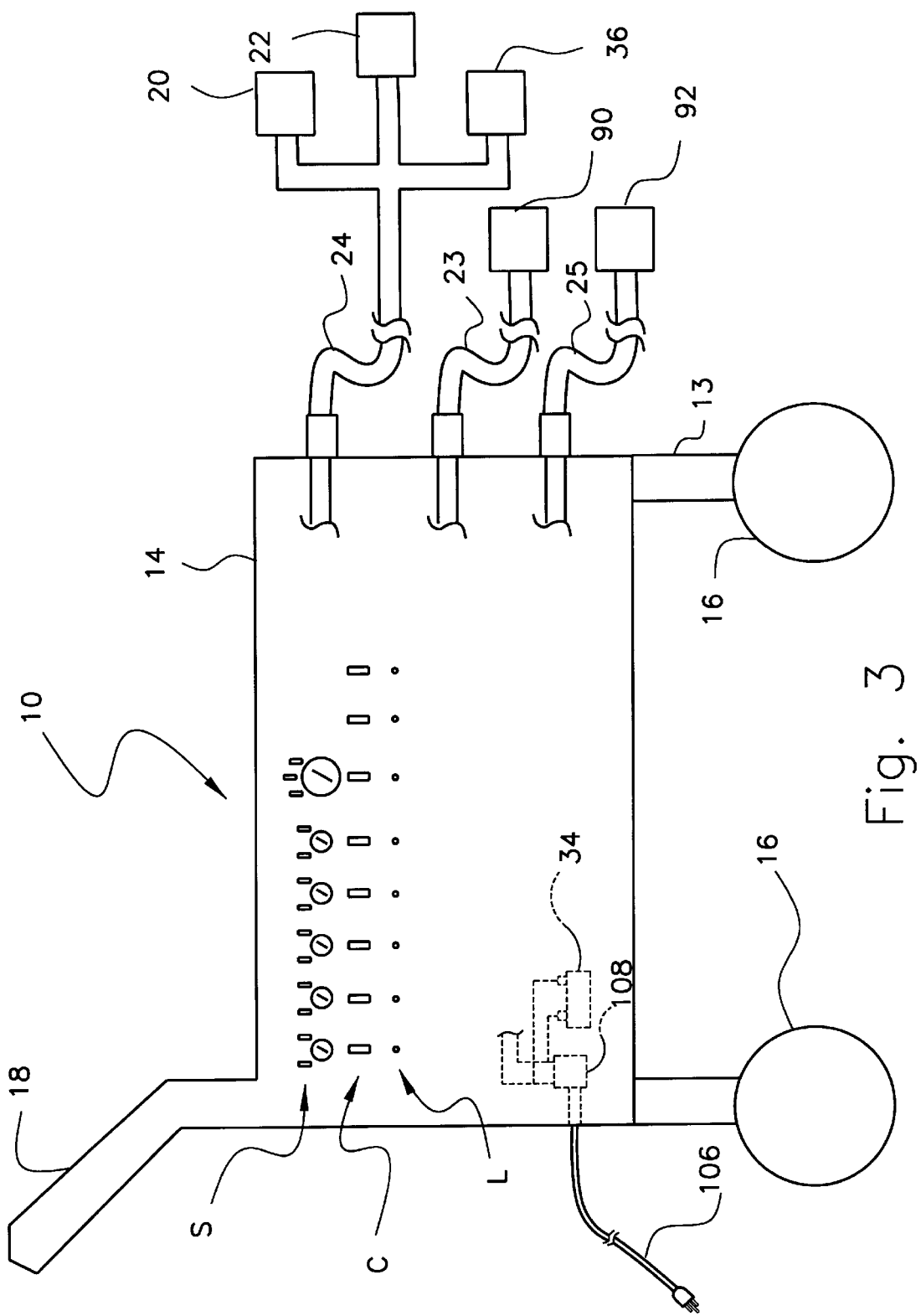
FIG. 3 is a large scale schematic view of the invention, showing details of the various connectors of the present invention.

Referring to FIGS. 1 and 3, tester 10 has a wiring bundle 24 which carries all the wiring necessary to energize and test the electrical systems of a trailer to each of three dissimilar wiring connectors 20, 22, and 36. Wiring connectors 20, 22, and 36 are selected from a number of standard varieties employed extensively in the transportation industry. Different or dissimilar connectors are provided so that tester 10 can be quickly connected to many of the various types of trailers in use today. For example, connector 20 can be a six-pin plug which fits the standard socket used for conducting electrical illumination signals from a towing vehicle (not shown) to horse trailers, heavy utility trailers, or trailer homes. Connector 22 can be a seven-pin plug which fits the standard socket used for conducting electrical illumination signals from a towing vehicle (not shown) to a freight hauling trailer. Connector 36 can be a four-pin plug which fits the standard socket used for conducting electrical illumination signals from a towing vehicle (not shown) to trailers used with passenger cars.

Although, in the illustrated example the dissimilar connectors are shown extending from the same wiring bundle 24, as an alternative, separate four-pin, six-pin, and seven-pin connectors can be provided on the front panel of the housing 14. Individual cables, each matching the pin numbers of a respective connector and each having appropriate types (in terms of male, female, etc.) of connectors at its two ends, can then be used to connect the respective connector to the corresponding type of trailer.

Pneumatic pressure hoses 23 and 25 also extends to trailer 12, the purpose of which will be explained hereinafter. The electrical connection enables testing of certain conventional circuits, including those operating tail lights 26, marker lights 28, brake or stop lights 30, and turn signals 32. In this view, both right and left turn signals are represented by the signal lights. Alarm indicating lamps, popularly known as four-way flashers, operate right and left signals simultaneously.

Once connected in the manner illustrated, individual circuits and systems are operated, and the results are noted. Tester 10 renders the tractor vehicle unnecessary for generating operating electrical and pressure signals.

Each type of connector 20 or 22 essentially duplicates those found on trailer towing vehicles and mates with matching female connectors on the trailer. A connector has terminals (see FIG. 2) for a plurality of individual conductors, each connected to a selected or predetermined illumination or signalling circuit of the trailer. Thus, each conductor of a given wiring connector corresponds to a predetermined function, illumination or signalling circuit. When connected, energizing of a selected trailer circuit will also energize a selected subcircuit within tester 10. Standardization of connectors and even of correlation of location of individual terminals with respect to which function or illumination circuit is powered thereby, enables rapid connection and testing.

Figure 2:
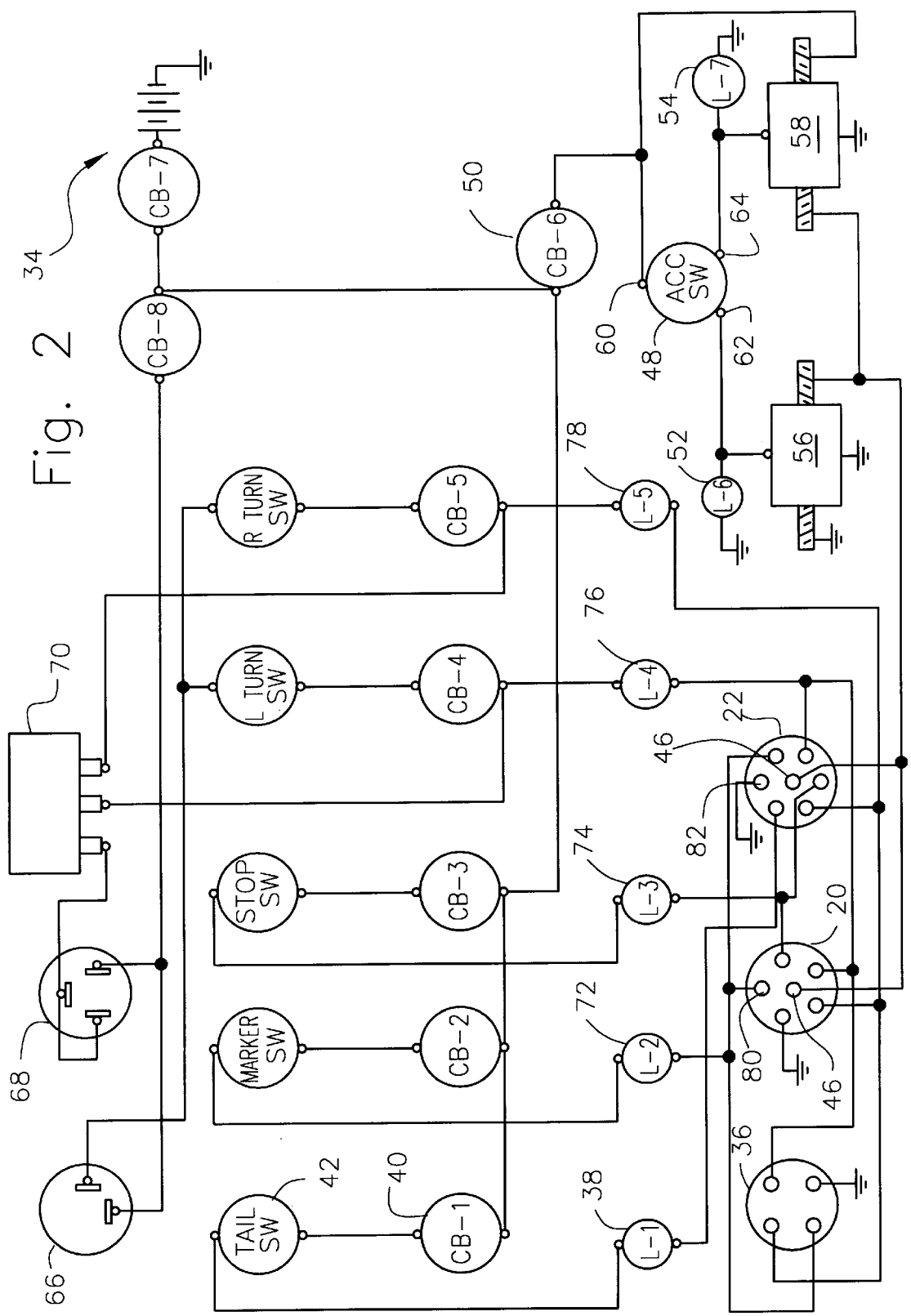
FIG. 2 is an electrical schematic drawing of the circuitry of the invention.

Electrical circuitry and components thereof which are disposed in or on housing 14 are shown in FIG. 2. Electrical circuitry includes a power source, such as battery 34, several subcircuits for testing individual illumination and signalling functions, and three modular wiring connectors 20,22,36.

A subcircuit is provided for each function to be tested. This arrangement is well known in the prior art, and components of subcircuits for testing each function will not be repetitively described. Subcircuits are provided to check the principal illumination and signalling functions set forth above, and a specialized subcircuit for providing power for miscellaneous or non-specific purposes.

A typical signalling and illumination circuit is shown at the left of FIG. 2, and includes annunciator lamp 38, circuit breaker 40, a two-position switch 42, and conductors 44 connecting these components to the rest of the circuitry. Visual annunciators are preferred, although the annunciator may be audible if desired. The overcurrent protective device is preferably a circuit breaker, since these are readily resettable, but may also be a fuse or fusible link, if desired. Any number or arrangement of overcurrent protective devices is possible at the discretion of the practitioner of the invention, the particular arrangement shown in this Figure being judged sufficient to protect all conductors.

Switch 42 closes and opens the circuit, thus selectively controlling its respective subcircuit.

Lamp 38 is responsive to successful energization of the circuit, and, when switch 42 closes the circuit, will illuminate if the corresponding circuit of the trailer is intact. If the circuit is defective, lamp 38 will remain extinguished.

All other subcircuits include respective lamps, circuit breakers, switches, and conductors making connection to power and extending the subcircuit to the appropriate terminal of the appropriate wiring connector 20,22, or 36.

It will be appreciated that certain signalling and illumination functions must be present on all road vehicles, and thus, certain functions are connected in parallel among wiring connectors 20,22,36. For example, all vehicles must have turn signals and running or marker lights, and appropriate terminals are all connected in common.

Six-conductor wiring connector 20 is typically employed with mobile homes, recreational trailers, and horse trailers. Seven-conductor wiring connector 22 are typically provided on large, over the road freight trailers. The electrical systems of these vehicles typically have positive conductors, indicated at terminals 46, which are connected in common.

No corresponding conductor is normally provided for small trailers, of the type normally drawn by a passenger automobile. Therefore, there is no corresponding terminal provided in wiring connector 36.

Thus, those terminals which serve similar purposes are connected in common at all wiring connectors. This arrangement confers immediate operability to tester 10 upon being plugged into the trailer electrical system. Obviously, electrical systems having more functions cannot be totally wired in common with those lacking certain functions.

The subcircuit defined by switch 48, circuit breaker 50, lamps 52 and 54, and solenoids 56 and 58 provides, selectively, continuity to positive and negative sides of battery 34. This enables less frequently encountered power accessories to be connected as is appropriate, and thereby tested. This feature may be employed to test such devices as electric brakes and winches.

Switch 48 is a three-position switch wherein one terminal is connected alternately and individually to the other two terminals. In this circuit, terminal 60 is in electrical communication with either terminal 62 or with terminal 64. Solenoids 56,58 are relays which operate in similar fashion to frequently employed engine starting solenoids, and are intentionally depicted to resemble such relays.

The electrical circuitry includes flashers 66,68,70 for operating flashing lights, such as turn signals and simultaneous four-light alarm lights, in conventional manner. Flashers 66,68,70 are provided by employing, for twelve volt systems, model numbers 262, 263, and 552 of Signal-Stat division of Federal Mogul Corporation, of Detroit, Michigan. These or equivalent flashers transmit an intermittent power signal to corresponding subcircuits, so that the subject lights may be readily identified due to their characteristic flashing. Four way flasher 70 is connected to operate both right and left turn signals simultaneously, in accord with standard transportation industry practice. Of course, testing of these circuits may proceed without flashers, if so desired.

Remaining subcircuits 72,74,76,78, are identified in the schematic of FIG. 2 by their respective indicating lamps, but will be understood to include respective two-position switches and associated conductors operably connecting these switches to power and to corresponding terminals on wiring connectors 20,22,36. Obviously, each subcircuit completes a circuit to one type of signalling and illumination function on the trailer.

Wiring connectors 20,22,36 are preferred since they correspond to wiring conventions most frequently encountered in the transportation industry. Connector 22, having seven conductors arranged as shown, wherein the topmost terminal 82 corresponds to a topmost electrode of a tractor and trailer wiring system (not shown), is employed in large, over the road, freight hauling tractor and trailer combinations. Connector 20, topmost terminal 80 also corresponding to the topmost terminal of its trailer counterpart (not shown), is typical of wiring systems of mobile homes, recreational trailers, and horse trailers. Connector 36 is typical of connections for smaller, passenger car drawn trailers.

Figure 4:
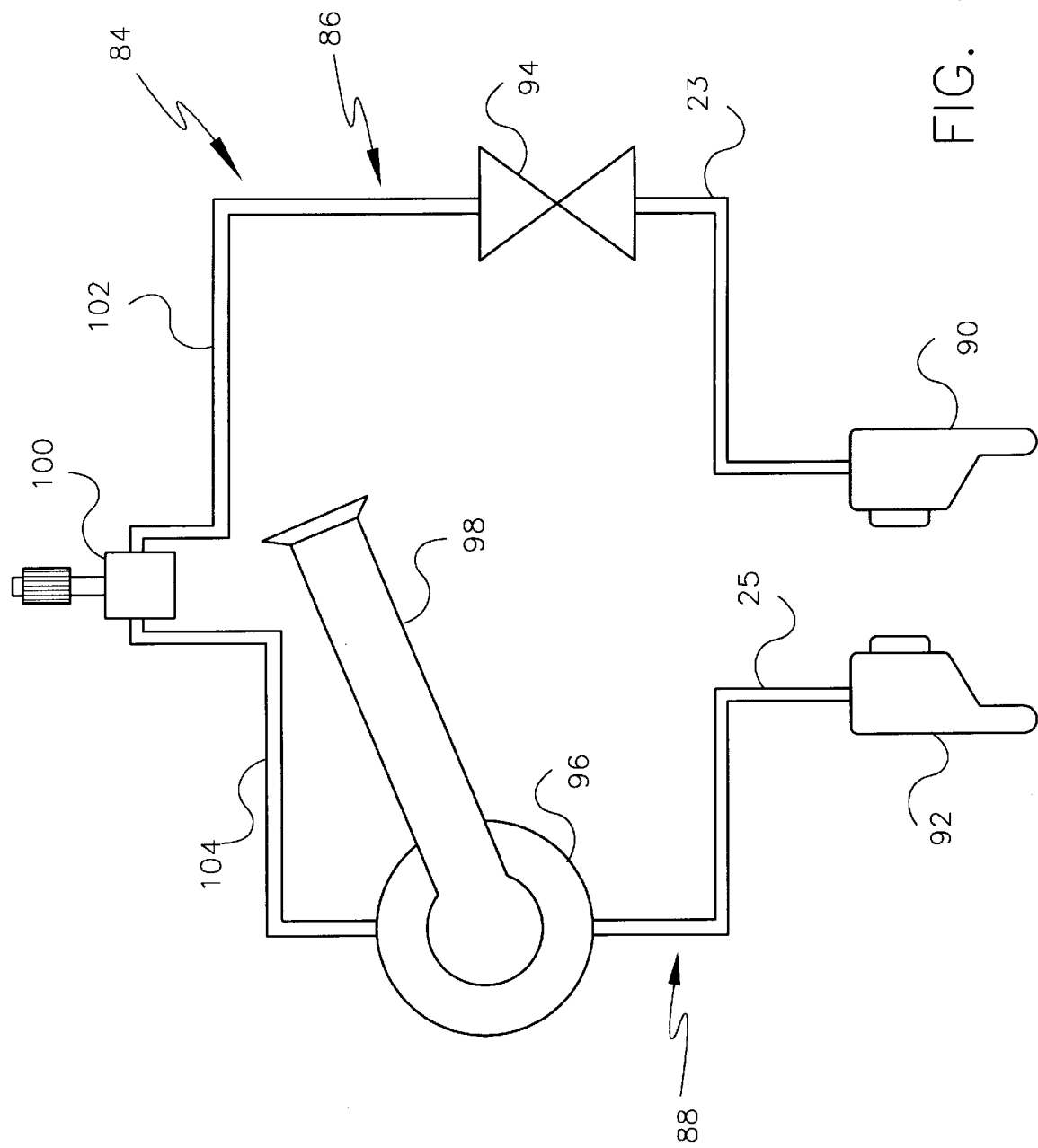
FIG. 4 is a schematic diagram of the pneumatic control system of the present invention.

For large trailers, additional testing features are provided. Referring now to FIGS. 3 and 4, a pneumatic system 84 for testing the pneumatic brakes of a heavy freight trailer is seen. The pneumatic system 84 includes an emergency circuit 86 and a service circuit 88. Pneumatic system 84 is connected to a source of air pressure (not shown) by a quick detachable coupler 100. The air pressure source is preferably shop air provided by the service station's high pressure air supply, or an air supply provided by a service truck. Alternatively, a compressor or a tank of compressed air (not shown) can be provided on the cart 13 itself to allow use of the cart independent of the shop air. The emergency circuit 86 includes a conduit 102 which conducts high pressure air to a push-pull button valve 94. Outlet of the valve 94 is connected to a "glad-hands" connector 90 via the pressure hose 23. The "glad-hands" connector is a type of connector well known in the art and will not be described in any detail here.

The service circuit 88 includes a conduit 104 which conducts high pressure air to a brake service valve 96. The brake service valve 96 has an actuating handle 98. Outlet of the valve 96 is connected to a "glad-hands" connector 92, via the pressure hose 25. The entire assembly shown in FIG. 4 is housed on the cart 13.

When the trailer 12 is disconnected from the pneumatic system of the towing tractor, the wheels of trailer 12 are locked up by an emergency braking system (not shown) which is biased to lock up the wheels of the trailer when the pneumatic system of the trailer 12 (also not shown) is not pressurized. This feature is standard in heavy freight trailers, and prevents the trailer from rolling down inclined surfaces when the trailer 12 is disconnected from the towing tractor. In addition, when the pneumatic system of the trailer 12 is connected to the pneumatic system of the towing tractor, actuation of the tractor brake pedal causes the braking of the wheels of trailer 12.

The assembly of FIG. 4 simulates the pneumatic system of the towing tractor. In operation, the shop air supply is connected to the quick detachable coupler 100 with the cart 13 positioned in proximity to the trailer 12. Then the "glad-hands" connector 90 is connected to the emergency brake system of the trailer and the "glad-hands" connector 92 is connected to the pneumatic braking system of the trailer 12. At this time, opening valve 94 causes the pressurization of the emergency brake system of the trailer 12. Thus, the emergency braking system of the trailer, which is biased to be engaged in the absence of air pressure, is disengaged when the valve 94 is opened. This arrangement allows the functioning of the emergency brakes to be tested.

Also at this time, actuating the valve 96 using lever 98 simulates the pressing of the tractor brake pedal, and causes the pneumatic brakes of the trailer to be activated. In this manner, the functioning of the pneumatic brakes of the trailer can be tested.

Integrity of the pneumatic system can be ascertained by audible detection of leaks, by observation to determine whether the system holds pneumatic pressure, and by operational tests, if desired.

Some trailer pneumatic systems operate by vacuum. An optional vacuum system including a vacuum pump driven by a motor, and controlled by suitable valves and switches, can be provided on cart 13 to test such vacuum systems. Also as another option, a hydraulic testing system may be utilized in conjunction with the cart 13. Thus, the cart may be used to provide the electrical connection for the hydraulic testing system which includes a reservoir for supplying hydraulic fluid, a hydraulic pump driven by a motor, suitable couplers and hoses for conducting hydraulic fluid under pressure to the hydraulic systems of the trailer, and suitable control switches and valves.

Switches S, circuit breakers C, and annunciating lamps L shown in the schematic of FIG. 2 are preferably mounted on the exterior of housing 14, so as to be readily visible and accessible. In addition, brake service valve 96 is positioned in housing 14 in such a manner as to allow lever 98 to be readily accessible from the exterior of housing 14. Air hose coupler 100 should also be positioned in housing 14 in such a manner as to allow the shop's air supply hose to be readily coupled to coupler 100 from the exterior of housing 14.

Tester 10 has a suitable power supply, which may comprise battery 34, and may also, if desired, include a suitable cord and plug 106 and AC-to-DC converter 108 to allow the AC shop current to power the testing circuitry and charge the battery 34.

The novel tester 10 thus set forth enables safety checks of a trailer in the absence of the towing vehicle. It can be wheeled about by one person, and can be employed to perform checks on different types of trailers having pneumatic and electrical systems. The electrical and pneumatic systems of the tester 10 are readily compatible with those of the trailers.

Figure 5:
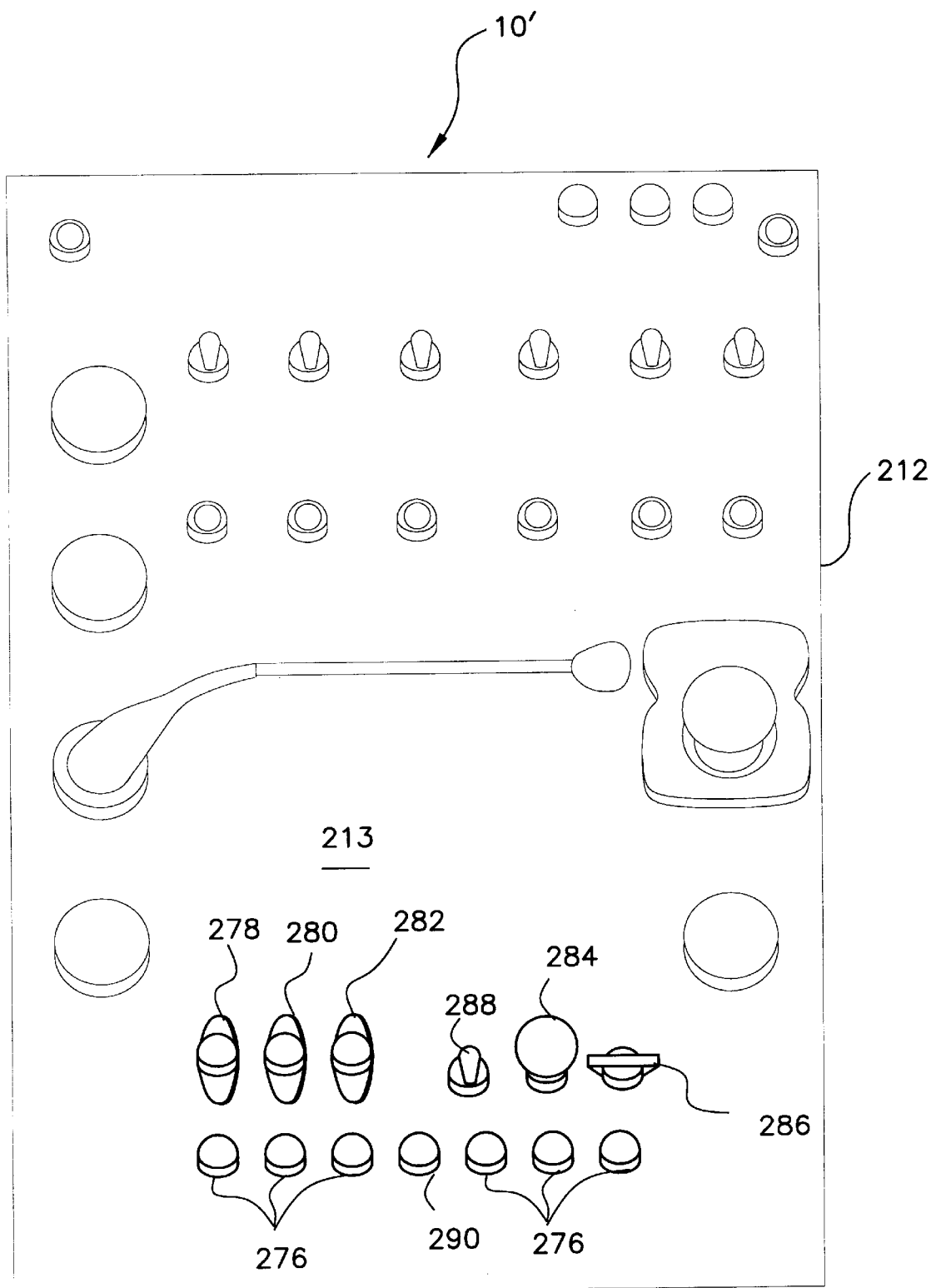
FIG. 5 is a top plan view of a control panel on the mobile testing cart which includes additional indicator lights and toggle switches for the school bus testing system.

According to a second embodiment of the invention, a tester 10' may further include a signal testing system for performing safety checks on illumination and signalling lighting circuits of a school bus. Because school buses have electrical systems which are configured with a greater number of individual circuits, the addition of the school bus signal testing system allows the tester 10' to be used for performing safety checks on both trailers and school buses. Referring now to FIG. 5, the tester 10' is shown incorporated into a mobile cart which includes a housing 212 having a control panel 213. Together the housing 212 and control panel 213 enclose the electrical circuitry of the school bus signal testing system and the various trailer testing systems described above. The mobility of the cart enables tester 10' to be maneuvered into place by the school bus, whether the bus is disabled on a street or in the shop, and subsequently tested by one operator.

Figure 6:
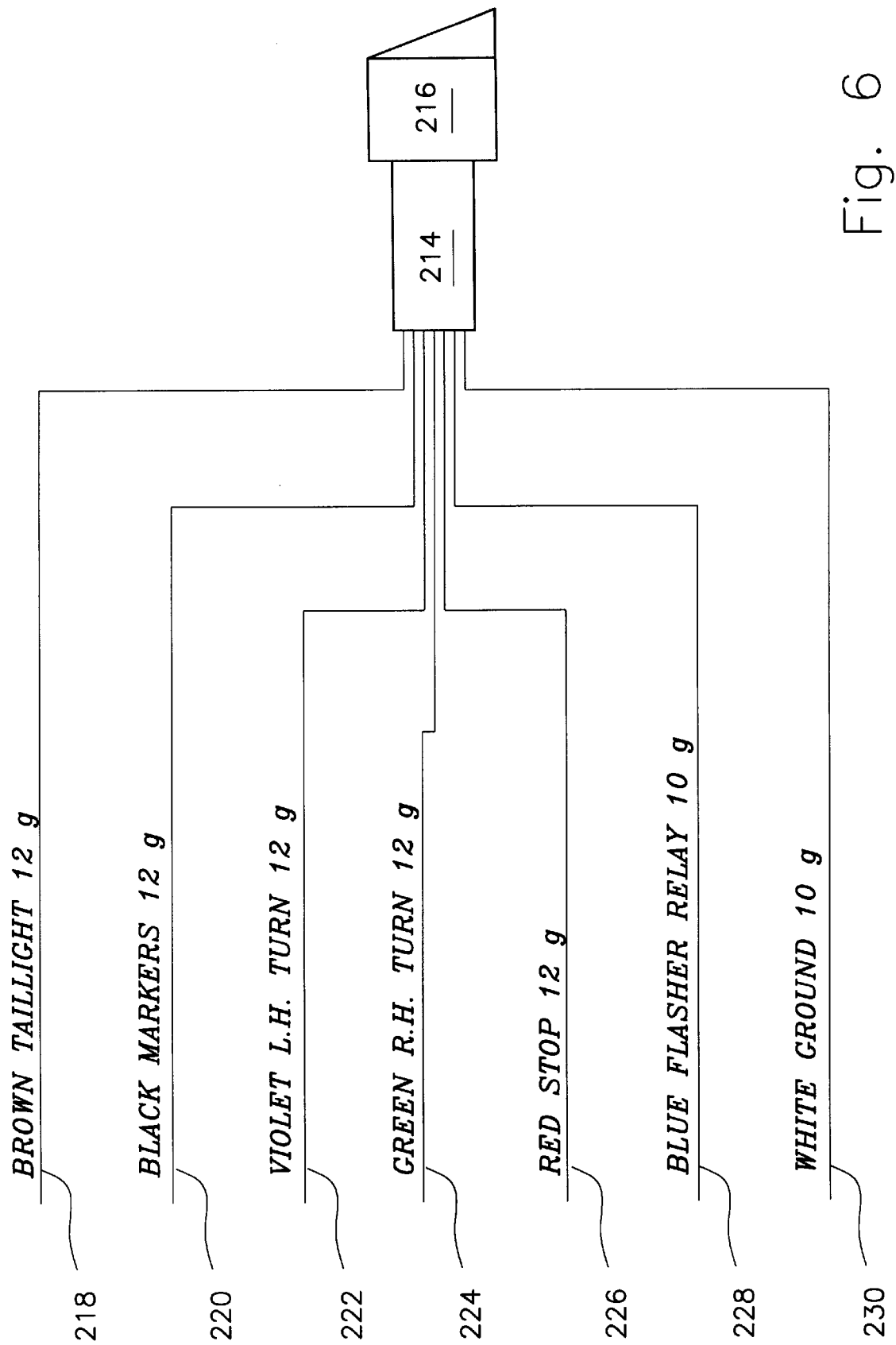
FIG. 6 is an electrical schematic drawing of the first portion of the electrical wiring system connected to a dashboard of a school bus.

Tester 10' includes a seven-wire modular wiring connector cable 214 (FIG. 6) having a seven-contact socket 216. The cable 214 is installed inside the dashboard of a school bus so that its socket 216 may receive a cable 274 (FIG. 9) which is employed to conduct electrical illumination signals from the bus to the tester 10'. Connector cable 214 contains seven wires coming from the bus circuitry. Since the wiring is color coded and may have different gauges, FIG. 6 shows the specific colors and gauges for each wire in the connector cable 214 as follows: wire 218 is a 12 gauge brown taillight wire; wire 220 is a 12 gauge black marker (clearance) light wire; wire 222 is a 12 gauge yellow left turn light wire; wire 224 is a 12 gauge green right turn light wire; wire 226 is a 12 gauge red stop or brake light wire; wire 228 is a 10 gauge blue flasher relay wire routed to the flasher motor panel 238 (FIG. 7); and wire 230 is a 10 gauge white ground wire.

Figure 7:
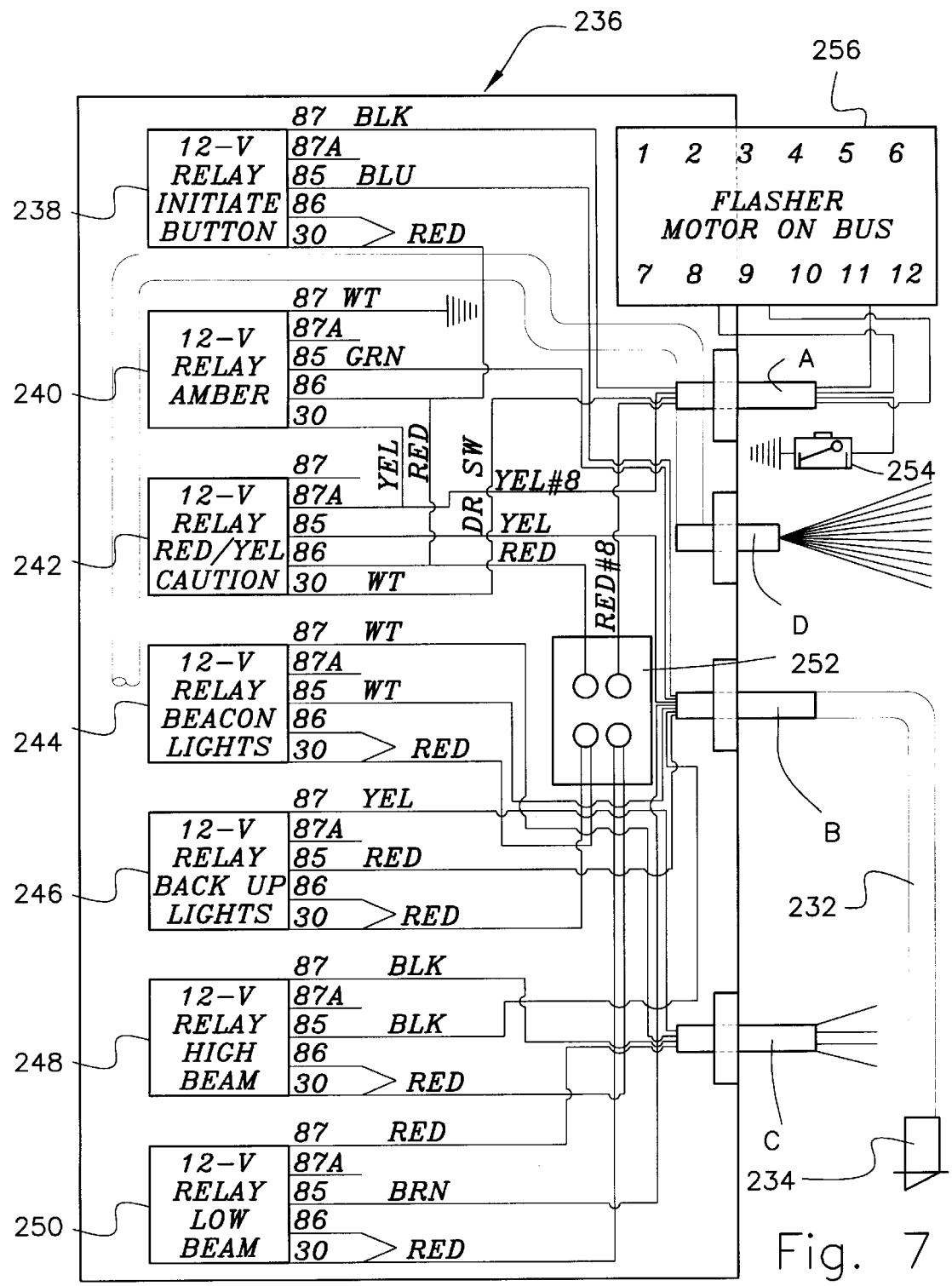
FIG. 7 is an electrical schematic drawing of the second portion of the circuitry installed inside the school bus.

Referring now to FIG. 7, a second seven-wire (14 gauge) conductor cable 232 with an outside seven-contact mobile home socket 234 is connected to a relay module box 236 as cable B. The relay module box 236 also is installed under the dashboard. Seven 12-volt relay switches 238, 240, 242, 244, 246, 248, and 250 are located inside along with a junction box 252. Relay switch 238 is an initiator for relay switches 240 and 242, which override the door switch of the bus. Relay switches 240 and 242 control the lighting of the eight-light warning system on the bus, which during normal operation is triggered upon opening of the bus door. Relay switch 244 controls the beacon lights located on the roof and which are amber and yellow strobe lights capable of cycled on/off operation at a rate of one hundred cycles per minute. The beacon lights are utilized under foggy or heavy traffic conditions. Relay switch 246 controls the white back up lights. Relay switch 248 controls the high beam headlights. Relay switch 250 controls the low beam headlights.

Cable A is a loom of four conductor wires, wherein one wire is connected to a push button bus door switch 254 which is grounded. The three remaining wires go to a transistorized flasher motor 256 in the bus and connect to pins 8, 9 and 11. Inside the relay module box 236, the black wire from pin 11 of the flasher motor 256 is connected to a standardized pin numbered 87 of the relay switch 238. The yellow wire from pin 8 is connected to the relay switch 242 at pin 87A. The red wire from pin 9 is connected to the junction box 252 located inside the relay module box 236.

Cable B or the second 7-wire conductor cable has the following connections: first blue wire to pin 85 of the relay switch 238; second green wire to pin 85 of the relay switch 240; third yellow wire to pin 85 of the relay switch 242; fourth brown wire to pin 85 of the relay switch 250; fifth white wire to pin 85 of the relay switch 244; sixth black wire to pin 85 of the relay switch 248; and the seventh red wire to pin 85 of the relay switch 246.

Cable C has four wires connected as follows: first yellow wire (back up lights) connected to pin 87 of the relay switch 246; second white wire (beacon lights) connected to pin 87 of the relay switch 244; third black wire (high beam headlights) connected to pin 87 of the relay switch 248; and the fourth red wire (low beam headlights) connected to pin 87 of the relay switch 250.

Figure 8:
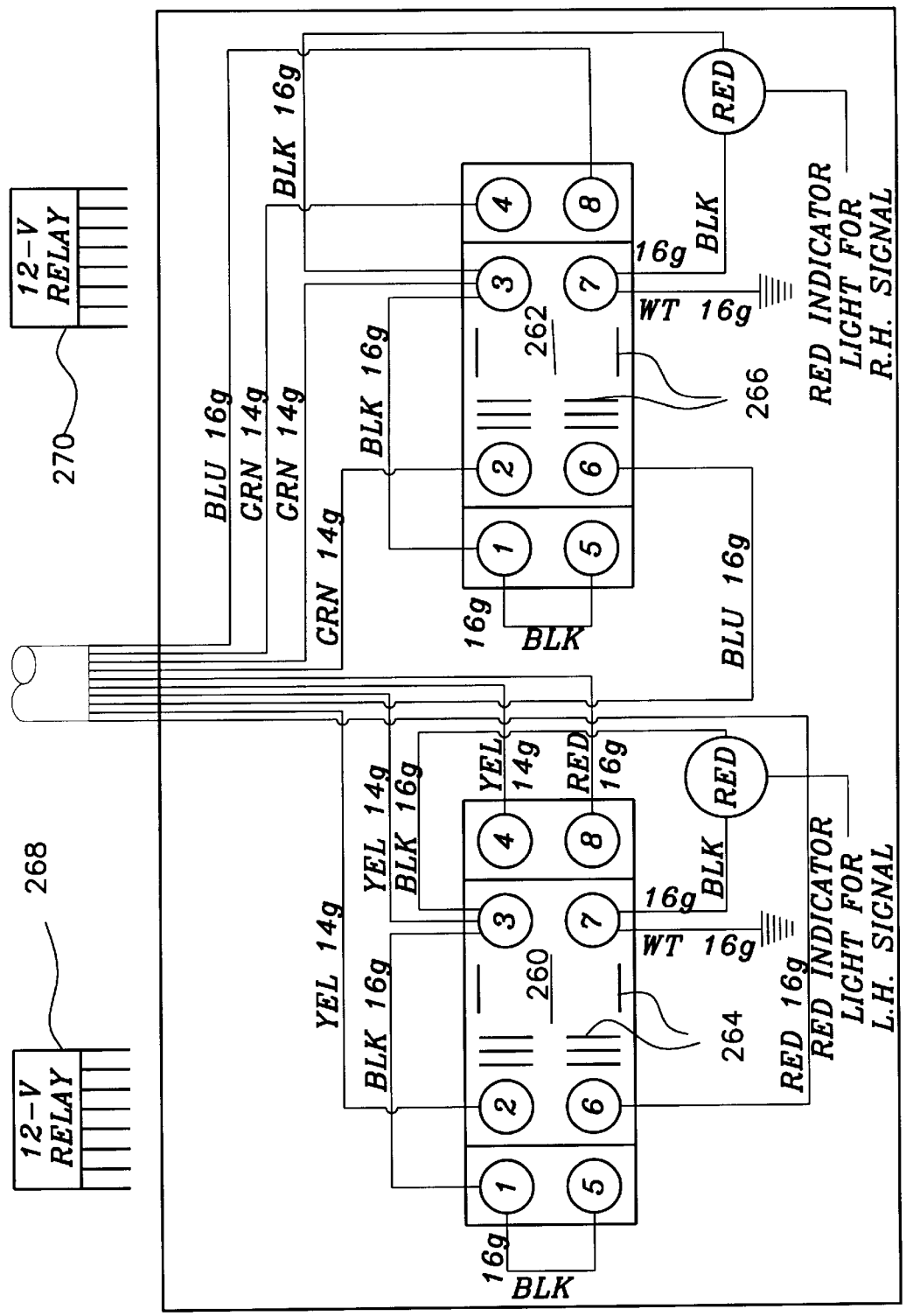
FIG. 8 is a continuation of the FIG. 7 electrical schematic drawing.

Cable D has a loom of ten wires (shown in FIG. 7) going to the signal tester unit 10'. The loom is bundled to connect to the circuit diagrammed in FIG. 8 and 12-volt relay plug-in bases 260 and 262, each having eight connections numbered from one to eight. The FIG. 8 circuit is inside the relay module box 236 A left-side 12-volt relay switch module 268 having eight spade pins is plugged into the plug-in base 260 in slots 264. Similarly, the right-side 12-volt relay switch module 270 is plugged into the plug-in base 262 in slots 266. It should be noted that the arrangement of the eight spade pins of each relay switch module is schematically depicted, but would fit into the arrangement of the slots 264, 266 shown accurately in the respective plug-in bases 260, 262.

In each plug-in base 260, 262, there are eight screw terminals numbered from one to eight, and the ten wires are connected to specific terminals with five wires to each plug-in base. Although different wires are connected for each side, the screw terminals are connected to the same set of wires as follows: terminal 2 receives the signal stat or lever wire (four-way flasher) and the rear light signal on the steering column from the signal tester unit 10'; terminal 3 receives the seven-conductor cable 274 coming from the tester 10'; terminal 4 receives the rear light signals from the bus; terminal 6 receives the signal stat or lever wire (four-way flasher) and the front light signal on the steering column from the bus; and terminal 8 receives the front turn signal on the bus. In the circuit diagram of FIG. 8, it is further shown that the red indicator light for either a left or right turn signal is connected to the grounded terminal 7 on each plug-in base 260, 262.

Figure 9:
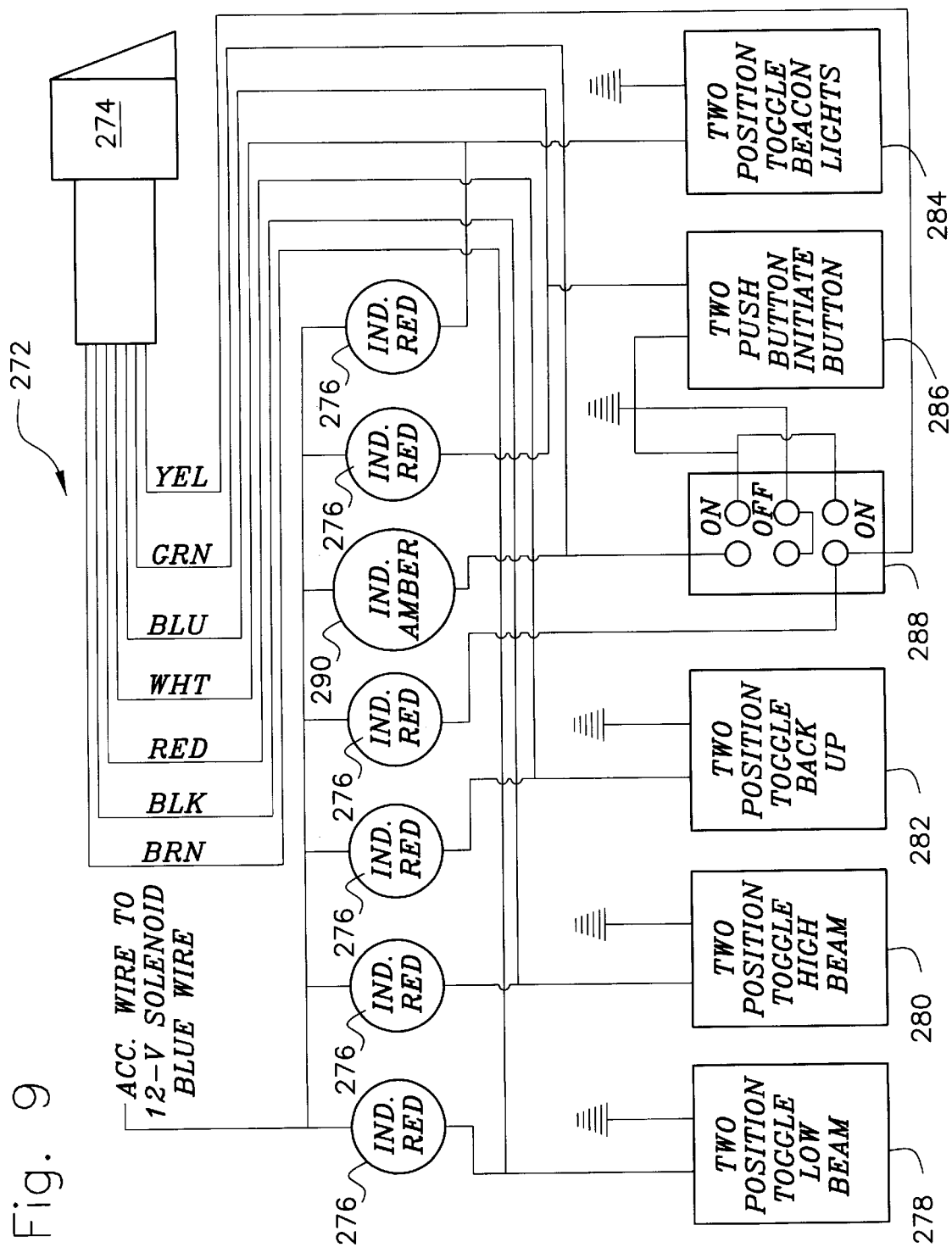
FIG. 9 is an electrical schematic drawing of the electrical circuit and indicator lamps incorporated in the mobile cart.

Referring now to FIGS. 5 and 9, the circuit diagram for the school bus illumination and signal testing system inside the tester 10' and the respective outside controls on the control panel 213 are depicted. A third seven-wire socket connector 274 has the colored wires each connected to a red indicator lamp or annunciator 276. The brown wire is connected to the two-position toggle switch 278 to test the low beam headlights of the bus. The black wire is connected to the two-position toggle switch 280 to test the high beam headlights. The red wire is connected to the two-position toggle switch 282 to test the back up lights. The white wire is connected to the two-position toggle switch 284 to test the beacon lights. The blue wire is connected to the two-position push button (down and up) initiate button 286, which controls all the red bus lights when the bus door is open. The green wire is connected to the upper "on" position of the three-position toggle switch 288 and lights up the amber lamp or annunciator 290 to warn of a defect in the four amber lights of the eight-light circuit (a set each of two red lights and two amber or yellow lights on the front and rear of the bus). The yellow wire is connected to a lower "on" position of the three-position toggle switch 288 which checks the four red bus lights. The "off" position is a neutral position.

The electrical connection of the present invention enables the testing of certain conventional circuits, including those operating headlights, tail lights, marker lights, back up lights, brake or stop lights, and turn signal lights. Alarm indicating lamps, popularly known as four-way flashers, operate right and left signals simultaneously. Once connected in the manner illustrated, individual circuits and systems are operated, and the results are noted. Tester 10' enables one person to test the operating electrical signals.

Overcurrent protective devices are to be included in the circuitry, but are not shown. The protective devices are preferably circuit breakers because they are readily resettable; however, the protective devices may also be fuses or fusible links. Any number or arrangement of overcurrent protective devices is possible at the discretion of the practitioner of the invention, however, the selected number or arrangement of protective devices should be sufficient to protect all conductors.

It should also be apparent to one skilled in the art that the circuitry for testing the electrical illumination and signalling system of a bus and the circuitry for testing the electrical illumination and signalling system of a trailer need not have separate seven-wire socket connectors, as described above. Instead, a single seven-wire socket connector may serve both separate testing systems of the tester 10' as long as a toggle switch or the like is provided for shifting the connection from one system to the other, as desired by the operator conducting safety inspections.

It is to be understood that the present invention is not limited to the embodiments described above, but encompasses any and all embodiments within the scope of the following claims.

I claim:

1. A school bus systems tester for performing safety checks on a school bus having illumination and signal lighting circuits, the systems tester comprising:

electrical circuitry connectable to and selectively energizing and annunciating illumination and signalling lighting circuits of the school bus;

said electrical circuitry having subcircuits, each serving a selected illumination and signalling lighting circuit;

each said subcircuit having a switch for selectively controlling its respective subcircuit;

an annunciator selected from a lamp and an audible element responsive to successful energization of each said subcircuit;

a housing enclosing said electrical circuitry; and a plurality of dissimilar modular wiring connectors each having a plurality of conductors, each individual conductor corresponding to one illumination and signalling function of the bus, individual conductors for each like illumination and signalling function of each said modular wiring connector being connected in parallel by said electrical circuitry to a predetermined said subcircuit, whereby like functions are energized and tested on buses having different modular wiring connectors by a designated one said subcircuit.

2. The school bus systems tester according to claim 1, further comprising:

a mating modular connector, said mating modular connector being permanently connected to the illumination and signal lighting circuits of the school bus, said mating modular connector being configured to receive one of said plurality of dissimilar modular wiring connectors.

3. The school bus systems tester according to claim 1, further comprising:

a cart supporting said housing;

wheels supporting said cart; and a handle attached to a rear portion of said cart, for maneuvering said cart.

4. The school bus systems tester according to claim 1, wherein said annunciators are comprised of lamps mounted on said housing.

5. The school bus systems tester according to claim 1, wherein each said subcircuit further comprises an overcurrent protective device operably connected thereto.

6. The school bus systems tester according to claim 1, wherein said electrical circuitry further comprises:

at least one flasher operably connected to said at least one subcircuit connected to a conductor corresponding to a turning signal circuit of the school bus, for transmitting an intermittent power signal to a corresponding said subcircuit of said school bus systems tester.

7. The school bus systems tester according to claim 1, further comprising:

a four-way indicator operably connected to a said subcircuit connected to a conductor corresponding to both turning signal circuits of the school bus, for transmitting an intermittent power signal to corresponding said subcircuits of said school bus systems tester.

8. The school bus systems tester according to claim 1, wherein said plurality of modular wiring connectors includes a seven-conductor modular wiring connector, whereby said school bus systems tester is compatible with a plurality of school buses.

9. The school bus systems tester according to claim 1, wherein said electrical circuitry further comprises:

an initiate subcircuit operably connected to an eight-light warning system of the school bus, for transmitting a power signal to a corresponding said subcircuit of said school bus systems tester.

10. The school bus systems tester according to claim 1, wherein said electrical circuitry further comprises:

a beacon subcircuit operably connected to beacon lights of the school bus, for transmitting a power signal to a corresponding said subcircuit of said school bus systems tester.

11. The school bus systems tester according to claim 1, wherein said electrical circuitry further comprises:

a caution light subcircuit operably connected to caution lights of the school bus, for transmitting a power signal to a corresponding said subcircuit of said school bus systems tester.

12. A school bus systems tester for performing safety checks on a school bus having illumination and signalling lighting circuits, the systems tester comprising:

a cart having a housing attached thereto, electrical circuitry enclosed within said housing, and connectable to and selectively energizing and annunciating illumination and signalling lighting circuits of the school bus;

said electrical circuitry having an electrical power supply and subcircuits, each serving a selected illumination and signalling lighting circuit;

each said subcircuit having a switch for selectively controlling its respective subcircuit, an overcurrent protective device, and an annunciator selected from a lamp and an audible element responsive to successful energization of each said subcircuit;

each said switch, said overcurrent protective device, and said annunciator being mounted on the exterior of said housing; and a seven-conductor modular wiring connector, whereby said school bus systems tester is compatible with a plurality of school buses, said modular wiring connector having a plurality of conductors, each individual conductor corresponding to one illumination and signalling function of said school bus, individual conductors for each like illumination and signalling function of each said modular wiring connector being connected in parallel by said electrical circuitry to a predetermined said subcircuit.

13. The school bus systems tester according to claim 12, further comprising:

a mating modular connector, said mating modular connector being permanently connected to the illumination and signal lighting circuits of the school bus, said mating modular connector being configured to receive said seven-connector modular wiring connector.

14. The school bus systems tester according to claim 12, wherein said electrical circuitry further comprises:

at least one flasher operably connected to at least one said subcircuit connected to a conductor corresponding to a turning signal circuit of the school bus, for transmitting an intermittent power signal to a corresponding said subcircuit of said school bus systems tester; and a four-way indicator operably connected to a said subcircuit connected to a conductor corresponding to both turning signal circuits of the school bus, for transmitting an intermittent power signal to corresponding said subcircuits of said school bus systems tester.

15. The school bus systems tester according to claim 12, wherein said electrical circuitry further comprises at least one subcircuit selected from the group consisting of:

an initiate subcircuit operably connected to an eight-light warning system of the school bus, for transmitting a power signal to a corresponding said subcircuit of said school bus systems tester;

a beacon subcircuit operably connected to beacon lights of the school bus, for transmitting a power signal to a corresponding said subcircuit of said school bus systems tester; and a caution light subcircuit operably connected to caution lights of the school bus, for transmitting a power signal to a corresponding said subcircuit of said school bus systems tester.

16. A systems tester for performing safety checks on trailers and school buses of the type having illumination and signalling lighting circuits, the system tester comprising:

a cart having a housing, wheels supporting said cart, and a handle for maneuvering said cart;

electrical circuitry enclosed within said housing, and connectable to and selectively energizing and annunciating illumination and signalling lighting circuits;

said electrical circuitry having subcircuits, each serving a selected illumination and signalling lighting circuit;

each said subcircuit having a switch for selectively controlling its respective subcircuit;

an annunciator selected from a lamp and an audible element responsive to successful energization of each said subcircuit; and at least one seven-conductor modular wiring connector;

wherein each of said modular wiring connectors has a plurality of conductors, each individual conductor corresponding to one illumination and signalling function, individual conductors for each like illumination and signalling function of each said modular wiring connector being connected in parallel by said electrical circuitry to a predetermined said subcircuit;

whereby illumination and signalling functions are energized and tested on trailers or school buses having different modular wiring connectors by a designated one said subcircuit.

17. The school bus systems tester according to claim 16, further comprising:

a mating modular connector, said mating modular connector being permanently connected to the illumination and signal lighting circuits of the school bus, said mating modular connector being configured to receive said at least one seven-conductor modular wiring connector.

18. The school bus systems tester according to claim 16, wherein:
said electrical circuitry comprises first and second electrical circuits;
said first electrical circuit being operative to perform said safety checks on said trailers; and
said second electrical circuit being operative to perform said safety checks on said school buses.

19. The school bus systems tester according to claim 16, wherein:
said at least one seven-conductor modular wiring connector comprises a first seven-conductor modular wiring connector and a second seven-conductor modular wiring connector;
said first seven-conductor modular wiring connector being operable connected to said first electrical circuit for performing said safety checks on said trailers; and
said second seven-conductor modular wiring connector being operable connected to said second electrical circuit for performing said safety checks on said school buses.

20. The school bus systems tester according to claim 16, wherein:
said at least one seven-conductor modular wiring connector comprises a single seven-conductor modular wiring connector;
said tester further comprises a seven-pole switch having first and second operative positions;
said seven-pole switch in said first operative position connects said first electrical circuit to said single seven-conductor modular wiring connector; and
said seven-pole switch in said second operative position connects said second electrical circuit to said single seven-conductor modular wiring connector.

21. The systems tester according to claim 16, further comprising:
at least one pneumatic hose connected to a pressurized air source and terminating in a glad hand, whereby a pneumatic system of said trailers or school buses can be connected to and pressurized from said systems tester.

22. The systems tester according to claim 16, wherein said electrical circuitry further comprises:
at least one flasher operably connected to at least one said subcircuit connected to a conductor corresponding to a turning signal circuit of said trailers or school buses, for transmitting an intermittent power signal to a corresponding said subcircuit of said systems tester; and
a four-way indicator operably connected to a said subcircuit connected to a conductor corresponding to both turning signal circuits of said trailers or school buses, for transmitting an intermittent power signal to corresponding said subcircuits of said systems tester.

23. The systems tester according to claim 16, wherein said electrical circuitry further comprises at least one subcircuit selected from the group consisting of:
an initiate subcircuit operably connected to an eight-light warning system of the school bus, for transmitting a power signal to a corresponding said subcircuit of said systems tester;
a beacon subcircuit operably connected to beacon lights of said school buses, for transmitting a power signal to a corresponding said subcircuit of said systems tester; and
a caution light subcircuit operably connected to caution lights of said school buses, for transmitting a power signal to a corresponding said subcircuit of said systems tester.

* * * * *